United States Patent [19]

Yee et al.

[11] Patent Number: 5,107,147

[45] Date of Patent: Apr. 21, 1992

[54] BASE CELL FOR SEMI-CUSTOM CIRCUIT WITH MERGED TECHNOLOGY

[75] Inventors: Ah-Lyan Yee, Mesquite; James D. Gallia, Dallas, both of Tex.

[73] Assignee: Texas Instruments Incorporated, Dallas, Tex.

[21] Appl. No.: 677,001

[22] Filed: Mar. 28, 1991

Related U.S. Application Data

[63] Continuation of Ser. No. 351,971, May 15, 1989.

[51] Int. Cl.[5] .......................................... H03K 19/177
[52] U.S. Cl. .............................. 307/465.1; 307/446; 357/45
[58] Field of Search ............... 307/443, 446, 451, 465, 307/465.1, 468–469; 357/45

[56] References Cited

U.S. PATENT DOCUMENTS 4,682,202  7/1987  Tanizawa .................... 307/446 X
4,827,368  5/1989  Suzuki et al. ............. 307/465.1 X

*Primary Examiner*—David Hudspeth
*Attorney, Agent, or Firm*—W. James Brady, III; Lawrence J. Bassuk; Richard L. Donaldson

[57] ABSTRACT

A BiCMOS gate array base is disclosed which is capable of simultaneously implementing a BiCMOS gate and/or a multitude of CMOS gates. The cell has symmetry about 1 axis, with the bipolar devices in the center and equally accessible for interconnect by two CMOS sections. The cell allows half-cell macro circuit blocks to be placed into the base cell in an independent and flexible fashion. The same macro can be placed in either CMOS section because of the mirror symmetry. The base cell can be divided into 2 units of macro placement. The number of devices in the CMOS section is variable. This cell architecture can be extended to other mixed technologies.

25 Claims, 5 Drawing Sheets

BASE CELL FOR SEMI-CUSTOM CIRCUIT WITH MERGED TECHNOLOGY

This is a continuation of application Ser. No. 07/351,971, filed May 15, 1989.

BACKGROUND OF THE INVENTION

Gate arrays are a type of programmable or semi-custom semiconductor component comprising logic gates having a fixed base pattern, base cells, on an integrated circuit which is programmed or wired by customized metal patterns generally referred to as macros.

In BiCMOS technology (BiCMOS being an acronym standing for bipolar and complementary metal oxide semiconductor), bipolar and complementary metal oxide semiconductor transistors have been formed on the same semiconductor substrate.

BiCMOS gate arrays, until now, have consisted primarily of base cells comprising a CMOS device and a bipolar device in a one-to-one ratio. FIG. 1a is a diagram which illustrates a typical BiCMOS base cell. As shown, a CMOS section lies next to a bipolar section in the cell. FIG. 1b illustrates a more detailed diagram of the CMOS and bipolar sections shown in FIG. 1a. The CMOS section comprises a p-channel and an n-channel device, each denoted by the letter C with the device type, p or n being labeled as such alongside. The bipolar section, as shown in FIG. 1b, includes a bipolar pull-up device, p.u., and a bipolar pull-down device, p.d.. FIG. 1c illustrates a diagram of an alternative base cell to that shown in FIG. 1a. The base cell in FIG. 1c results simply from turning the cell in FIG. 1a on its side. FIG. 1d shows an alternative base cell to that shown in FIG. 1c in which one half of the bipolar section is above the CMOS section and the other half of the bipolar section is below the CMOS section. The efficiency of these and other prior art base cells is poor. Implementation of logic functions using such base cells often result in large amounts of unused bipolar transistors area on the semiconductor substrate in order to fully accommodate the logic function.

A need exists for a BiCMOS gate array which has a base cell that allows increased substrate usage and better efficiency.

OBJECTS OF THE INVENTION

It is an object of the invention to provide a new and improved gate array.

It is another object of the invention to provide a new and improved base cell.

It is another object of the invention to provide a new and improved BiCMOS base cell for a BiCMOS gate array.

These and other objects of the invention, together with the features and advantages thereof, will become apparent from the following detailed specification when read together with the accompanying drawings in which applicable reference numerals and symbols have been carried forward.

SUMMARY OF THE INVENTION

The foregoing objects of the invention are accomplished by a BiCMOS gate array base cell comprising first and second half-cells. The first half-cell contains a bipolar section including a bipolar transistor and a first CMOS logic section which in operation performs CMOS logic. The second half-cell contains a second CMOS logic section which in operation also performs CMOS logic.

In a first preferred embodiment of the invention, the gate array base cell is substantially symmetrical about a line through the bipolar section. The bipolar section is accessible by either CMOS logic section. The base cell is capable of accepting the same macro placement in either CMOS logic section and is capable of accepting at least a total of two core units of macro placement.

The CMOS logic sections may comprise an inverter including a pair of MOS transistors operable in CMOS logic fashion and the second CMOS logic section may comprise at least one inverter with each inverter including a pair of MOS transistors which are operable in CMOS logic fashion.

BRIEF DESCRIPTION OF THE DRAWINGS

FIG. 1b illustrates a more detailed diagram of the CMOS and bipolar sections shown in FIG. 1a.

FIG. 1c illustrates a diagram of an alternative base cell to that shown in FIG. 1a.

FIG. 2b illustrates a more detailed diagram of the BiCMOS base cell shown in FIG. 2a.

FIG. 5b illustrates a mask set portion of the circuit formed in FIG. 5a.

DETAILED DESCRIPTION OF THE INVENTION

Figure 1A:
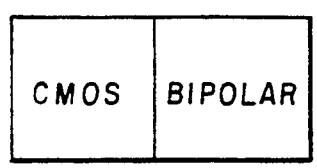
FIG. 1a is a diagram which illustrates a typical BiCMOS base cell.
Figure 1B:
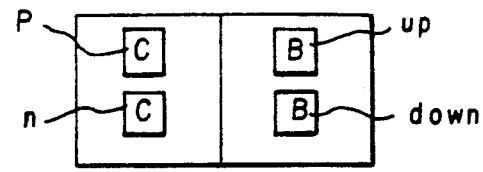
Figure 1C:
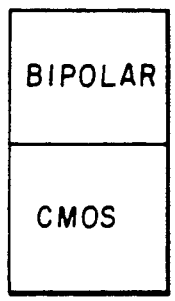
Figure 1D:
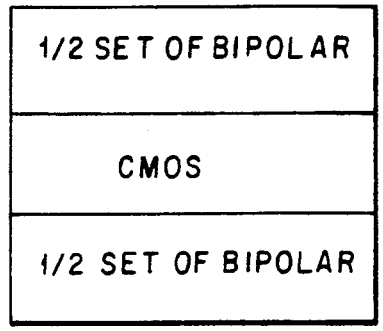
FIG. 1d is a diagram of an alternative base cell to that shown in FIG. 1c.
Figure 2A:
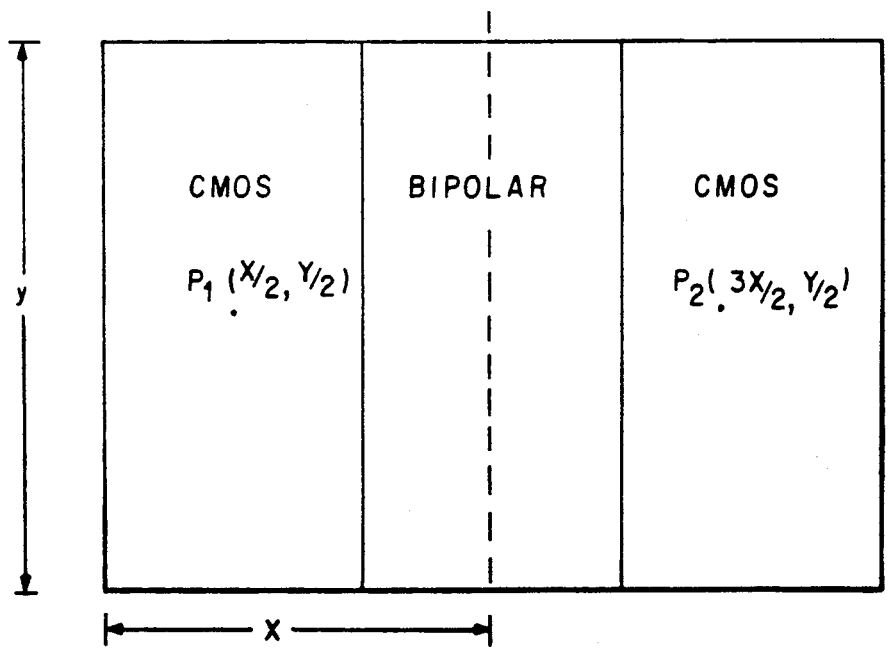
FIG. 2a illustrates a diagram of a BiCMOS base cell.

FIG. 2a illustrates a diagram of a preferred embodiment of the invention. As shown, in a BiCMOS gate array base cell, a bipolar section is interposed between two CMOS logic sections labeled CMOS.

Figure 2B:
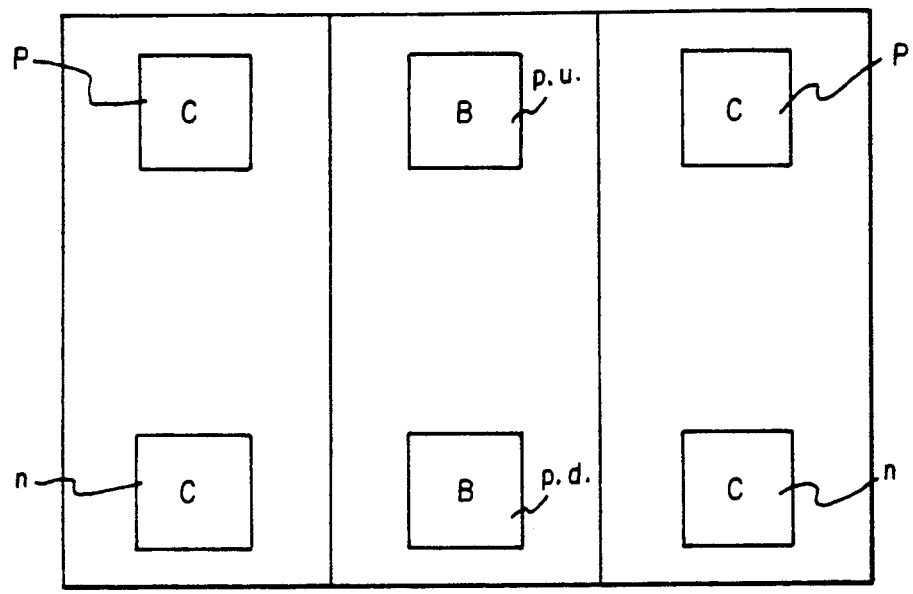

FIG. 2b illustrates a more detailed diagram of the BiCMOS base cell shown in FIG. 2a. The two CMOS sections each comprise a p-channel and an n-channel device, each denoted by the letter C with the device type, p or n being labeled as such alongside. The bipolar section, as shown in FIG. 2b, includes a bipolar pull-up device, p.u., and a bipolar pull-down device, p.d.. The pull-up and pull-down device can each comprise a bipolar driver transistor. Alternatively, a resistor or some combination of resistors can be used as the pull-up or pull-down device. Note that in the BiCMOS gate array that logic functions are generally implemented using the CMOS sections while driving functions are implemented using the bipolar section of the base cell. Symmetry in the base cell exists along the dashed line through the bipolar section. A macro with a set of CMOS transistors in the CMOS section and bipolar transistors in the bipolar section can be implemented by using the CMOS set on for instance, the left side and the bipolar set or alternatively the CMOS set on the right side and the bipolar set. Either way, a CMOS section is remaining which is available for another macro, with a macro using n/2 base cells where n = 1, 3, 5, . . . Thus, symmetry within the cell affords flexibility in that access and use can be achieved with the half cells of the base cell, a half cell comprising a CMOS section with a bipolar section or a CMOS section by itself. Note that the BiCMOS base cell in FIG. 2b is drawn onto a coordinate system with x as the abscissa and y as the ordinate. Point $P_1$, defined at coordinate (x/2, y/2) and point $P_2$ defined at coordinate (3x/2, y/2) can serve as references for forming macros using half base cells (referred to as half base cell macros). Thus, if two half base cell macros are implemented in a base cell, the set of bipolar transistors is in most instances generally only available for one half base cell macro, not for both half base cell macros.

Figure 3:
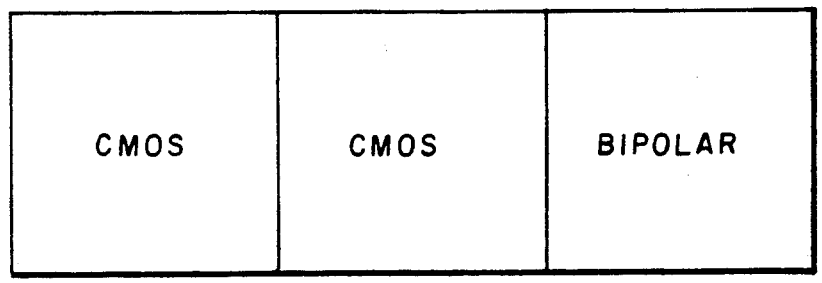
FIG. 3 illustrates a diagram of an alternative embodiment of the invention.

FIG. 3 illustrates a diagram of an alternative embodiment of the invention. As shown, two CMOS sections precede a bipolar section. Alternatively, the CMOS section could be placed after the bipolar section in order to form the base cell.

Although the foregoing examples of the invention's base cell have shown the ratio of CMOS to bipolar sections as two-to-one. It is within the scope of the invention to have a ratio greater than two-to-one. A plurality of CMOS sections comprising CMOS logic devices and a plurality of bipolar sections comprising bipolar devices, with the ratio of CMOS to bipolar sections being greater than one-to-one, are contemplated as being within the scope of the invention.

Figure 4:
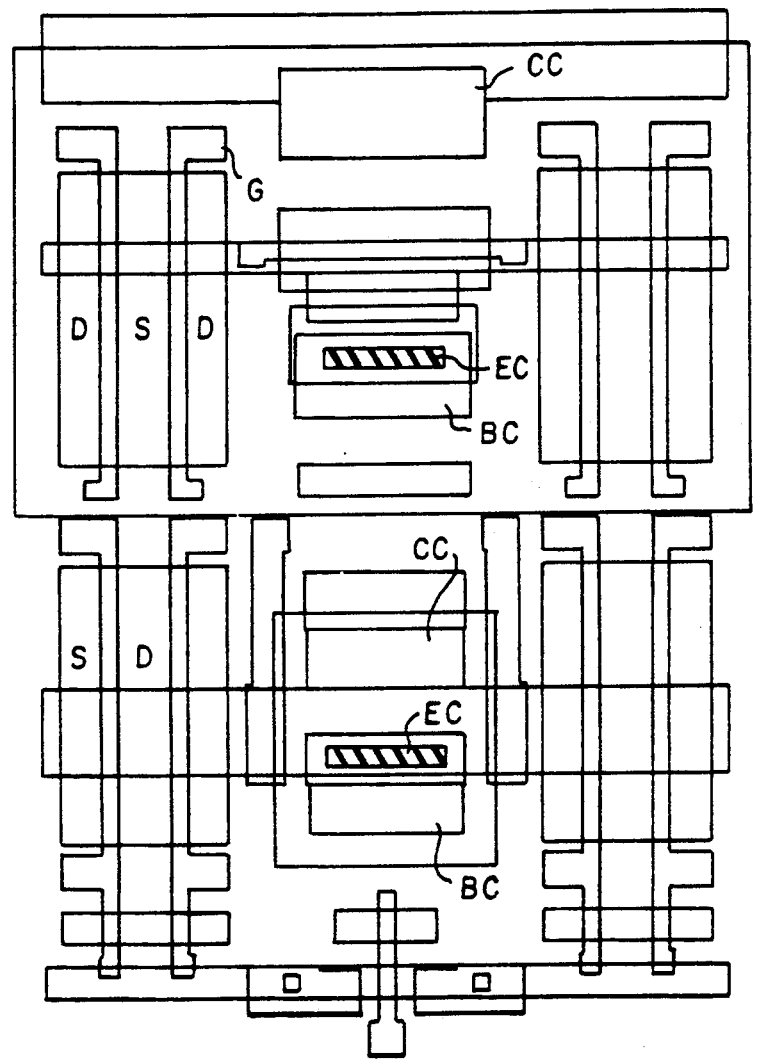
FIG. 4 illustrates a mask set portion of a base cell implemented according to the invention.

FIG. 4 illustrates a mask set portion of a base cell implemented according to the invention. Key sections are marked as follows: D=drain, S=source, EC=emitter contact, BC=base contact, CC=collector contact, G=gate.

Figure 5A:
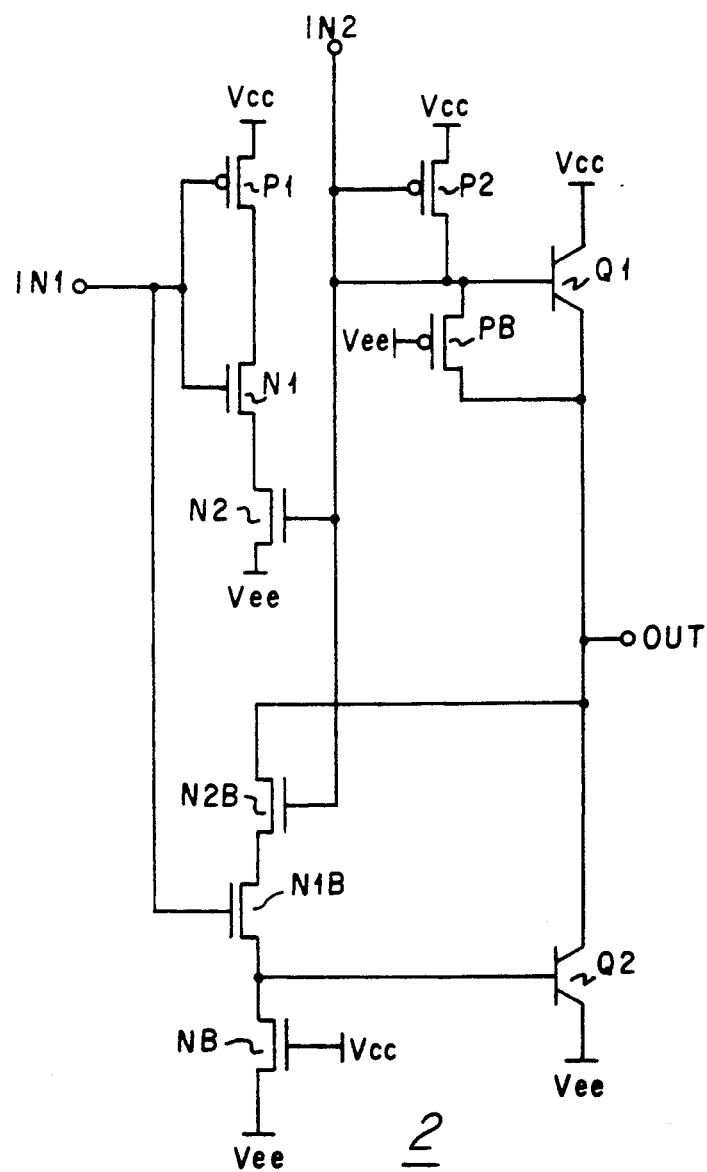
FIG. 5a illustrates a schematic drawing of a tow-input NAND circuit which was implemented using the invention.

FIG. 5a illustrates a schematic drawing of a two-input NAND circuit which was implemented using the invention. In a NAND gate logic circuit generally designated by numeral 2, a first pull-up device comprising npn bipolar transistor Q1 is coupled to output OUT. A second pull-up device comprising p-channel transistors P1 and P2 are connected to the base of transistor Q1 by their drains. The sources of transistors P1 and P2 as well as the collector of transistor Q1 is connected to supply voltage Vcc. P-channel transistor PB is connected to and between the base and emitter of transistor Q1 with its gate connected to voltage Vee. Vee throughout the description of the invention represents circuit ground. However, other values for Vee are contemplated and are possible. N-channel transistor NB and a first pull-down device comprising npn bipolar transistor Q2 are coupled to the output of circuit 2. A switch comprising n-channel transistors N1B and N2B connected together are connected between circuit output 2 and transistors NB and Q2. N-channel transistors N1 and N2 are connected between the circuit inputs at IN1 and IN2 and are coupled to the transistors of the first and second pull-up devices.

Figure 5B:
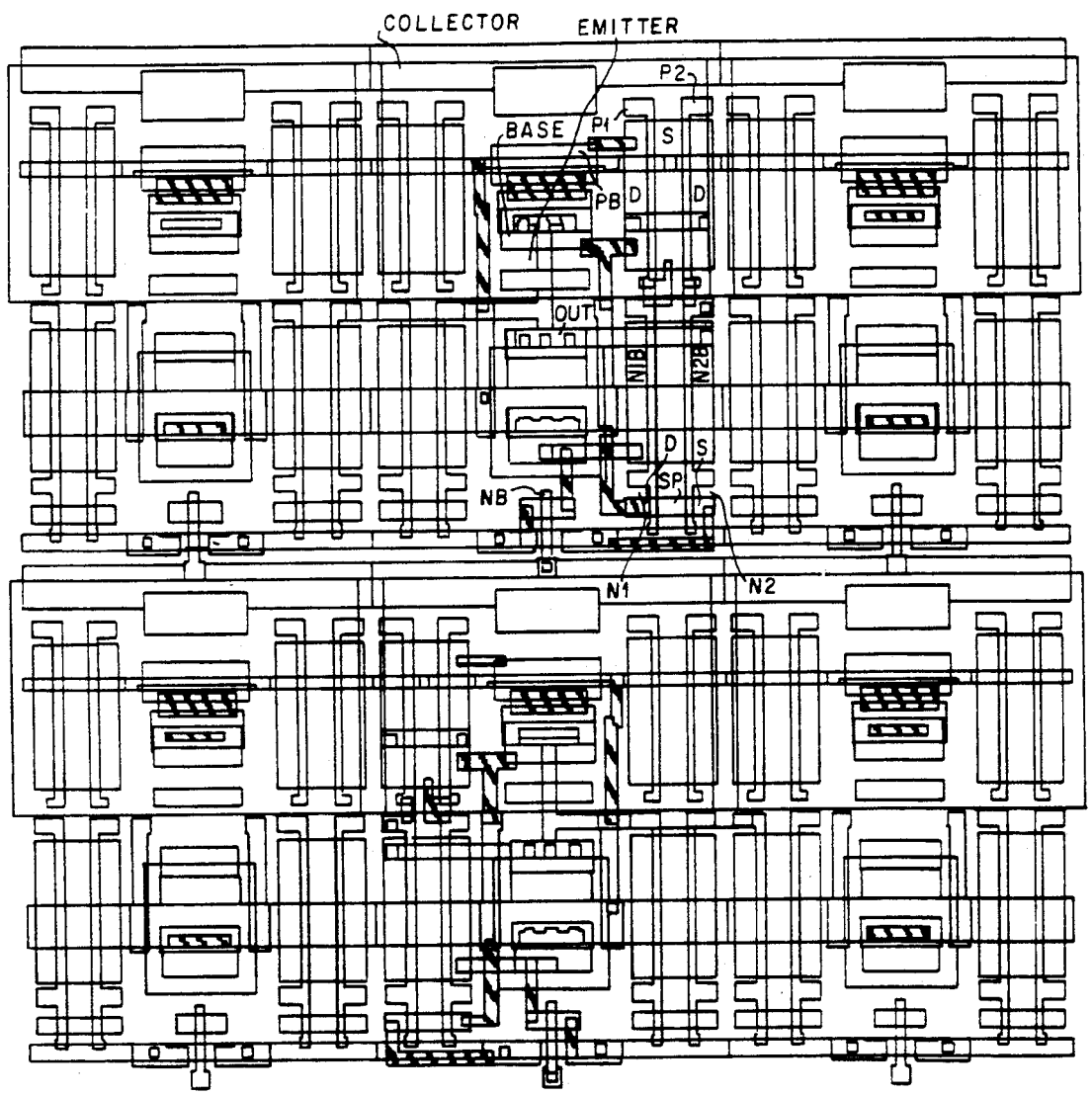

FIG. 5b illustrates a mask set portion of the circuit formed in FIG. 5a. Areas are marked as shown for reference.

Although the invention has been described in detail, it is to be understood that this description is by way of example only, and is not to be construed in a limiting sense. It is to be further understood that numerous changes in the details of the embodiments of the invention, and additional embodiments of the invention will be apparent to and may be made by persons of ordinary skill in the art having reference to this description. For instance, pnp bipolar transistors may be used and substituted for npn bipolar transistors and vice-versa. Furthermore, p-channel transistors may be substituted for n-channel transistors and vice-versa. Additionally note that although only a NAND was shown as the implemented logic expression that all logic expressions can be implemented using the invention. The cell architecture as described in the foregoing can be easily adapted to other mixed technologies besides BiCMOS. It is contemplated that all such changes, additions, and adaptations are well within the spirit and true scope of the invention as claimed below. Accordingly, the invention is intended to be limited only by the scope of the appended claims.

We claim:

1. A gate array base cell comprising:
a first section including a first bipolar transistor; and
a pair of second sections, each of said second sections including first and second field effect transistors of a first conductivity type with a gate of said first field effect transistor being coupled to a gate of said second field effect transistor, each of said second sections including third and fourth field effect transistors of said first conductivity type with a gate of said third field effect transistor being coupled to a gate of said fourth field effect transistor, a source-drain current path of said first field effect transistor being coupled to a source-drain current path of said third field effect transistor, and a source-drain current path of said second field effect transistor being coupled to a source-drain current path of said fourth field effect transistor.

2. The gate array base cell of claim 1 in which said first section includes a second bipolar transistor of the same conductivity type as said first bipolar transistor, a field effect transistor of said first conductivity type and a field effect transistor of a second conductivity type opposite said first conductivity type.

3. The gate array base cell of claim 1 in which each of said second sections includes fifth and sixth field effect transistors of a second conductivity type opposite said first conductivity type.

4. The gate array base cell of claim 1 in which each of said second sections includes a first electrode which forms the gates of said first and second field effect transistors, a second electrode which forms the gates of said third and fourth field effect transistors, a third electrode which forms a gate of said fifth field effect transistor, and a fourth electrode which forms a gate of said sixth field effect transistor.

5. The gate array base cell of claim 2 in which said first and second bipolar transistors are NPN bipolar transistors.

6. The gate array base cell of claim 3 in which said field effect transistors of said first conductivity type are n-channel field effect transistors and said field effect transistors of said second conductivity type are p-channel field effect transistors.

7. The gate array base cell of claim 1 in which said gate array base cell is substantially symmetrical about a line through said first section.

8. The gate array base cell of claim 2 in which said gate array base cell is substantially symmetrical about a line through said first and second bipolar transistors, said field effect transistor of said first conductivity type and said field effect transistor of said second conductivity type of said first section.

9. The gate array base cell of claim 1 in which each of said second sections is capable of accepting the same macro placement.

10. A gate array base cell comprising:
   a first section including first and second bipolar transistors and a pair of field effect transistors, a first one of said pair of field effect transistors located between first and second contacts of said first bipolar transistor and a second one of said pair of field effect transistors located between said second bipolar transistor and an edge of said gate array base cell; and
   a pair of second sections, each second section laterally spaced from a line through said first section and including a plurality of field effect transistors.

11. The gate array base cell of claim 10 in which said first section is substantially symmetrical about a line through said first bipolar transistor, said second bipolar transistor, and said pair of field effect transistors.

12. The gate array base cell of claim 10 in which said first and second bipolar transistors are NPN transistors.

13. The gate array base cell of claim 10 in which said first one of said pair of field effect transistors is of a first conductivity type and said second one of said pair of field effect transistors is of a second conductivity type opposite said first conductivity type.

14. The gate array base cell of claim 13 in which said first one of said pair of field effect transistors is a p-channel transistor and said second one of said pair of field effect transistors is an n-channel transistor.

15. The gate array base cell of claim 10 in which said gate array base cell is substantially symmetrical about said line.

16. The gate array base cell of claim 10, in which said first and second bipolar transistors are of the same conductivity type, said first contact is a collector contact and said second contact is an emitter contact, said line extends through said first and second bipolar transistors, and said first section is substantially symmetrical about said line.

17. A gate array base cell comprising:
   a first section including first and second bipolar transistors; and
   a pair of second sections, each second section laterally spaced from a line through said first section and including first, second, and third field effect transistors, said first field effect transistor being of a first conductivity type and located adjacent a first edge of said gate array base cell, said second field effect transistor being of a second conductivity type opposite said first conductivity type and located adjacent a second edge of said gate array base cell, said third field effect transistor being of said second conductivity type and located between said first and second field effect transistors.

18. The gate array base cell of claim 17 in which each of said second sections includes fourth, fifth, and sixth field effect transistors, said fourth field effect transistor being of said first conductivity type and located adjacent said first field effect transistor, said fifth field effect transistor being of said second conductivity type and located adjacent said second field effect transistor, said sixth field effect transistor being of said second conductivity type and located adjacent said third field effect transistor.

19. The gate array base cell of claim 18 in which said first field effect transistor has a first gate electrode, said second and third field transistors have a second, common gate electrode separate from said first gate electrode, said fourth field effect transistor has a third gate electrode, and said fifth and sixth field effect transistors have a fourth, common gate electrode which is separate from said third gate electrode.

20. The gate array base cell of claim 17, in which said first and second bipolar transistors are of the same conductivity type, said line extends through said first and second bipolar transistors, and said first section is substantially symmetrical about said line.

21. A gate array including a plurality of base cells, each base cell comprising:
   a first section including a first bipolar transistors; and
   a pair of second sections, each of said second sections including first and second field effect transistors of a first conductivity type with a gate of said first field effect transistor being coupled to a gate of said second field effect transistor, each of said second sections including third and fourth field effect transistors of said first conductivity type with a gate of said third field effect transistor being coupled to a gate of said fourth field effect transistor, a source-drain current path of said first field effect transistor being coupled to a source-drain current path of said third field effect transistor, and a source-drain current path of said second field effect transistor being coupled to a source-drain current path of said fourth field effect transistor.

22. A gate array including a plurality of base cells, each base cell comprising:
   a first section including first and second bipolar transistors and a pair of field effect transistors, a first one of said pair of field effect transistors located between first and second contacts of said first bipolar transistor and a second one of said pair of field effect transistors located between said second bipolar transistor and an edge of said gate array base cell; and
   a pair of second sections, each second section laterally spaced from a line through said first section and including a plurality of field effect transistors.

23. The gate array of claim 22, in which said first and second bipolar transistors are of the same conductivity type, said first contact is a collector contact and said second contact is an emitter contact, said line extends through said first and second bipolar transistors, and said first section is substantially symmetrical about said line.

24. A gate array including a plurality of base cells, each base cell comprising:
   a first section including first and second bipolar transistors; and
   a pair of second sections, each second section laterally spaced from a line extending through said first section and including first, second, and third field effect transistors, said first field effect transistor being of a first conductivity type and located adjacent a first edge of said gate array base cell, said second field effect transistor being of a second conductivity type opposite said first conductivity type and located adjacent a second edge of said gate array base cell, said third field effect transistor being of said second conductivity type and located between said first and second field effect transistors.

25. The gate array of claim 24, in which said first and second bipolar transistors are of the same conductivity type, said line extends through said first and second bipolar transistors, and said first section is substantially symmetrical about said line.

* * * * *